U S008525710B1

United States Patent
Tsang et al.

(10) Patent No.: US 8,525,710 B1
(45) Date of Patent: Sep. 3, 2013

(54) AUDIO AMPLIFIER OFFSET REDUCTION USING DIGITAL INPUT/OUTPUT COMPARISONS

(75) Inventors: Robin Matthew Tsang, Austin, TX (US); Eric J. Swanson, Buda, TX (US); John L. Melanson, Austin, TX (US); John Christopher Tucker, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 627 days.

(21) Appl. No.: 12/750,973

(22) Filed: Mar. 31, 2010

(51) Int. Cl.
H03M 1/06 (2006.01)
H03M 1/66 (2006.01)
H03F 99/00 (2009.01)

(52) U.S. Cl.
USPC .......................................... 341/118; 381/121

(58) Field of Classification Search
USPC ................. 381/120, 121, 56–59, 94, 96, 111, 381/116, 117; 341/144, 118
See application file for complete search history.

(56) References Cited

U.S. PATENT DOCUMENTS

| 6,605,990 | B2 * | 8/2003 | Vermeeren | 330/9 |
| 6,771,122 | B2 * | 8/2004 | Jin et al. | 330/69 |
| 6,903,593 | B2 * | 6/2005 | Wang | 327/307 |
| 7,248,105 | B2 * | 7/2007 | Koen | 330/9 |
| 7,583,210 | B2 * | 9/2009 | Minobe | 341/118 |
| 2006/0007029 | A1 * | 1/2006 | Ito | 341/144 |
| 2011/0055877 | A1 * | 3/2011 | Lesso | 725/75 |
| 2011/0123049 | A1 * | 5/2011 | Crespi et al. | 381/121 |

* cited by examiner

Primary Examiner — Mohammad Islam
Assistant Examiner — David Ton
(74) Attorney, Agent, or Firm — Andrew Mitch Harris; Mitch Harris, Atty at Law, LLC

(57) ABSTRACT

An offset correction circuit removes DC offset from an analog audio output signal by comparing transitions of digital audio values to which the analog output signal is related to the output of a monitor that monitors the analog output signal. The monitor may be a zero-crossing detector and the transitions of the digital signal that are compared may be transitions of the most-significant bit (MSB) of the digital audio values. A filtering algorithm or filter circuit may be used to average a result of the comparison of the transitions, so that the offset is slowly and accurately removed. A chopped or autozero comparator may be used to further reduce error in the offset determination.

21 Claims, 7 Drawing Sheets

AUDIO AMPLIFIER OFFSET REDUCTION USING DIGITAL INPUT/OUTPUT COMPARISONS

BACKGROUND OF THE INVENTION

1. Field of the Invention

The present invention relates generally to audio amplifiers, and more specifically, to techniques for reducing offset generated between a digital audio input and the amplifier output.

2. Background of the Invention

Audio amplifiers typically exhibit offset due to internal offsets in the amplifier and/or due to offset present in the input signal that is passed to the output of the amplifier. In systems having a digital input, the no-signal level can generally be relied upon to have no offset for most program content, as the processing of the program content generally includes removing any DC offset. However, once the digital signal has been converted to an analog output, the problem of circuit-generated offset remains.

In particular, in circuits using switched resistor networks to control the gain of one of the audio amplifiers in the signal chain, there is a trade-off between resistor size and allowable offset, for a given gain selection resolution and accuracy. In such circuits, it is generally necessary to allow some offset to be present, or the resistor area required will become too large.

DC offset at an analog audio output also wastes power, reduces dynamic range and presents a problem of generating pops when the analog audio output is enabled, disabled or when the gain of an audio amplifier that amplifies the offset is changed. In present-day battery operated devices using high-efficiency headphone drivers, even a small offset, e.g. 10 mV, can waste power at a level comparable to that required to operate the device at nominal listening levels.

Therefore, it would be desirable to provide techniques for removing offset from an analog audio output signal.

SUMMARY OF THE INVENTION

The above stated objective of removing offset from an analog audio output signal is accomplished in a circuit and method. The method is a method of operation of the circuit.

The circuit includes an audio output monitor that monitors the analog audio output signal and compares an output of the audio output monitor to digital values from which the analog output signal is derived. The analog audio output signal is then corrected using a result of the comparison. Transitions in the output of the audio output monitor are compared to transitions in the digital values. For example, the audio output monitor may be a zero-crossing detector and transitions of the output of the zero-crossing detector may be compared to transitions in the most-significant bit (MSB) of the digital values to provide a measurement of DC offset as between the digital input values and the analog output signal.

A filtering circuit or algorithm may be employed to average a result of the comparisons so that the DC offset is corrected based upon measurements made over an extended time period. A chopped comparator circuit can be used to further reduce error in the DC offset measurement.

The foregoing and other objectives, features, and advantages of the invention will be apparent from the following, more particular, description of the preferred embodiment of the invention, as illustrated in the accompanying drawings.

DESCRIPTION OF ILLUSTRATIVE EMBODIMENT

The present invention encompasses audio output circuits that include techniques for reducing a voltage offset at the audio output by monitoring the voltage at the audio output with an audio output monitor and comparing transitions in an output of the audio output monitor with transitions in a digital signal from which the voltage at the audio output is generated. While zero-crossings may be absent from both the digital source and the analog output for certain intervals, noise and certainly playback of program material will cause transitions to occur in both, which will cause the servo loop in the present invention to correct the offset at the audio output. In combination with an audio output disable that completely shuts off the audio output when program material is not being played, which is the most likely condition in which transitions in the digital input and audio output will be absent, a power-saving methodology is provided that can entirely, or almost entirely, eliminate waste of battery energy due to audio output offset in portable devices.

Figure 1:
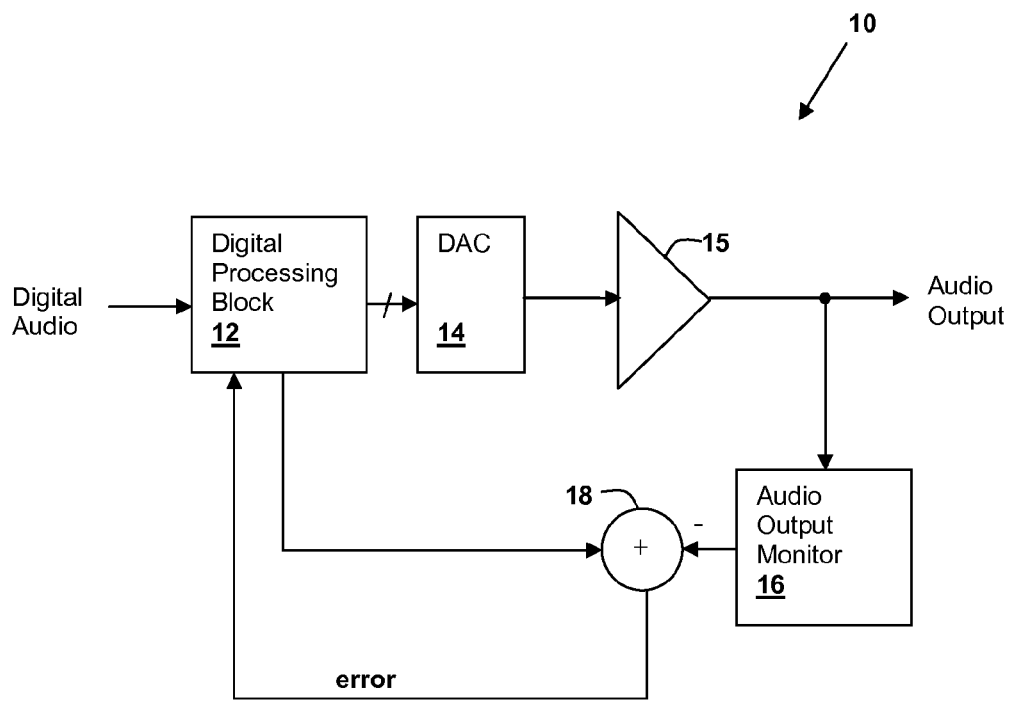
FIG. 1 is a block diagram depicting an audio output circuit 10 in accordance with an embodiment of the present invention.

Referring now to FIG. 1, an audio output circuit 10, in accordance with an embodiment of the present invention, is shown. An amplifier 15 receives an output of a digital-to-analog converter (DAC) 14, which receives digital audio input from a digital processing block 12. An audio output monitor 16 generates transitions when audio output monitor 16 detects that a voltage at an audio output terminal Audio Output provided by amplifier 15 crosses a threshold voltage. Other events indicative of the offset of the voltage at audio output terminal Audio Output could be detected by audio output monitor 16 and used as an indication of the offset magnitude. Therefore, the present invention is not limited to zero-crossing detection or comparison to another threshold such as a DC midpoint voltage value in single-supply amplifier circuits. Digital processing block 12 generates a signal that is compared by a comparison circuit 18 with an output of audio output monitor 16 to generate a digital error signal error that is sent to digital processing block 12 to adjust the numeric offset of the digital output provided as input to DAC 14. Audio output monitor 16, comparison circuit 18 and digital processing block 12 thus form a feedback portion of a servo control loop that reduces the DC offset in the output voltage at audio output terminal Audio Output, generally, to a voltage determined by the limits of the accuracy of the detection performed by audio output monitor 16.

Figure 2:
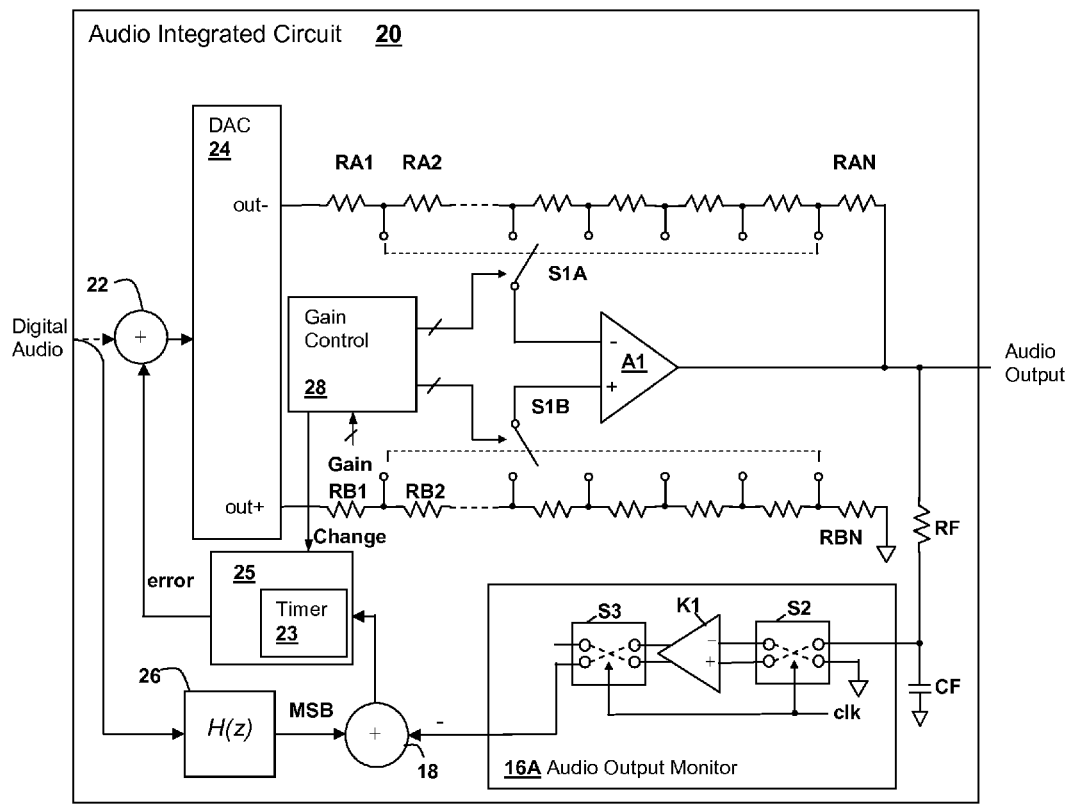
FIG. 2 is a simplified schematic diagram depicting an audio integrated circuit (IC) 20 in accordance with an embodiment of the present invention.

Referring now to FIG. 2, an audio integrated circuit 20, in accordance with an embodiment of the present invention, is shown. An amplifier A1 receives a differential output of a digital-to-analog converter (DAC) 24 provided from terminals out+ and out−. The differential output of DAC 24 is multiplied by a gain or attenuation factor to generate a voltage at audio output terminal Audio Output. Resistors RA1-RAN provide a resistor chain with a switch position selected by switch element S1A and resistors RB1-RBN provide another resistor chain with a switch position selected by switch element S1B. Switch element S1A and S1B are ganged, i.e., they are generally always set to identical switch positions, so that a differential amplifier is formed having a gain/attenuation magnitude set by the ratio of the resistance between the output of amplifier A1 and the selected switch position to the resistance between the selected switch position and the corresponding output of DAC 24. Therefore the switch position selected by gain control 28 sets the gain of the output stage of audio integrated circuit 20 formed by amplifier A1 and acts as a volume control in the audio integrated circuit. In the depicted embodiment, gain control 28 generally sets a fixed gain or a variable gain settable by a gain value Gain provided as an input to gain control 28. The relatively large number of resistors needed to provide fine gain control raises the amount of offset present. Further, mismatch between the resistors in the two resistor chains formed by resistors RA1-RAN and resistors RB1-RBN, respectively, cause an offset in the output of amplifier A1.

To remove the offset, as mentioned above, a servo control loop is provided using an audio output monitor 16A to detect when the output of amplifier A1, as filtered in exemplary audio integrated circuit 20 by a low-pass filter formed by resistor RF and capacitor CF. The output of the low-pass filter is provided to a chopped comparator formed by switches S2, S3 and comparator K1. The low-pass filter formed by resistor RF and capacitor CF is optional, and is provided to prevent switching transients from being imposed on the output of amplifier A1 from being caused by the switching of the switched comparator. Since the output of amplifier A1 may, for example, contain shaped noise if DAC 24 is a delta-sigma modulator type DAC, the transients generated by the switched comparator can mix with the out-of-band components of the output of amplifier A1 to generate in-band tones. The chopped comparator is shown operated by a clock signal clk, but as will be explained below, the chopping can also be pseudo-random to prevent a concentration of energy at the chopping frequency and its multiples, which may intermodulate with out-of-band energy (either noise or tones) to cause unwanted signals to appear in the audio band.

Combiner 18 operates, as in the circuit of FIG. 1, to compare the output of audio output monitor 16A with a version of the digital audio signal, which in audio integrated circuit 20 is first conditioned by a transfer function block 26 that has a response tailored to match the response from the digital audio input to the output of amplifier A1. At a minimum, the delay of the signals arriving at combiner 18 is matched, so that phase errors do not cause the servo loop to continuously attempt to interpret a phase error as a voltage offset error, but ideally the full frequency and phase response of the audio output circuit is matched, so that error is minimized and so that the servo loop will converge rapidly. An error value, which is generally a slowly changing least-significant-bit (LSB) error signal, but may be larger depending on overhead and signal scaling, is provided from a signal processing block 25 that averages the difference between the MSB (sign bit) of the digital audio signal and the effective MSB of the output of amplifier A1, as generated by combiner 18. Another combiner 22 removes the determined error value error from the values of digital audio input Digital Audio.

Signal processing block 25 may include a timer 23 that causes error value error to be held, except at periodic intervals, e.g., every 100 milliseconds, to apply accumulated error counts to update error value error. As long as the rate of the updates is less than 20 Hz and the shifts in offset are small, they will be inaudible. Additionally, in accordance with particular embodiments of the present invention, measurements may be selectively made and/or updates to error value error may be selectively applied when an indication Change from gain control 28 indicates that the volume setting has been changed, so that the offset is not continuously correcting when no new offset value is likely present. The timer and volume change triggered update techniques may be combined, so that when volume changes are occurring, the offset is updated continuously, and when volume changes are not occurring, the updates are performed periodically. While the specific example shown in FIG. 2 is that of a headphone amplifier circuit having a digital input, the techniques of the present invention may be applied to other audio output circuits that generate an analog output from a digital audio input.

Figure 3A:
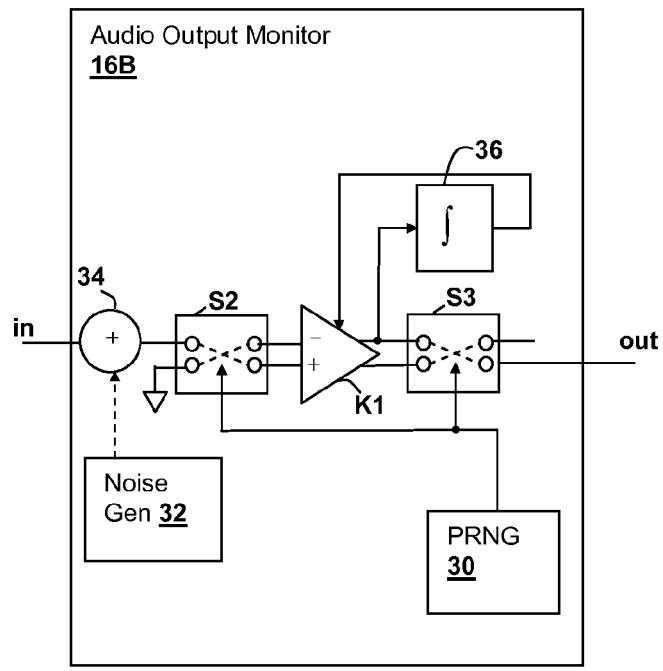
FIG. 3A is a schematic diagram depicting an audio output monitor circuit 16B that may be used to implement audio output monitor circuit 16 of FIG. 1, in accordance with an embodiment of the present invention.

Referring now to FIG. 3A, an audio output monitor circuit 16B that may be used to implement audio output monitor circuit 16 of FIG. 1, or used as an alternative to audio output monitor circuit 16A of FIG. 2, is shown. The chopped comparator formed by switches S2-S3 and comparator K1, will exhibit a dead-band equal to twice the internal offset of comparator K1. The dead-band can cause the offset-correcting servo loop to stall before the ideal correction of the offset voltage at audio output terminal Audio Output is complete. To prevent the above-described condition, an integrator 36 is added having an input connected to one of the outputs of comparator K1, which integrates the state of the output of comparator K1 and provides a feedback signal to comparator K1 so that the intrinsic offset of comparator K1 can be removed by calibration (offset adjusting) circuitry within comparator K1. Assuming that the output of comparator K1 can either be +1 or −1 in value, integrator 36 will integrate an average value of zero if comparator K1 is chopped and the output of amplifier A1 never falls within the dead-band of comparator K1. However, if the output of amplifier A1 does fall in the dead-band, and if comparator K1 has a positive intrinsic offset, the average value at the input to integrator 36 will have a negative average value. The negative average value at the input to integrator 36 causes integrator 36 to provide a negative valued feedback signal to calibration circuitry within comparator K1, which removes the positive intrinsic offset. The converse polarities apply for a negative intrinsic offset in comparator K1. As an alternative, a white noise generator 32 can be used to inject a dithering signal via summer 34 to prevent the input signal from falling into the dead-band for long durations. Since the average value of the white noise is zero and there are no tones, the feedback signal will eventually reach and stabilize at the desired offset-compensating value. Switches S2 and S3 in audio output monitor circuit 16B are also controlled by a pseudo-random noise generator (PRNG) 30, which, as mentioned above, spreads the spectrum of the chopping action of the chopped comparator formed by switches S2-S3 and comparator K1, in order to prevent unwanted tones from appearing at audio output terminal Audio Output in the audio band due to inter-modulation between the chopping frequency and out-of-band energies in the voltage at audio output terminal Audio Output.

Figure 3B:
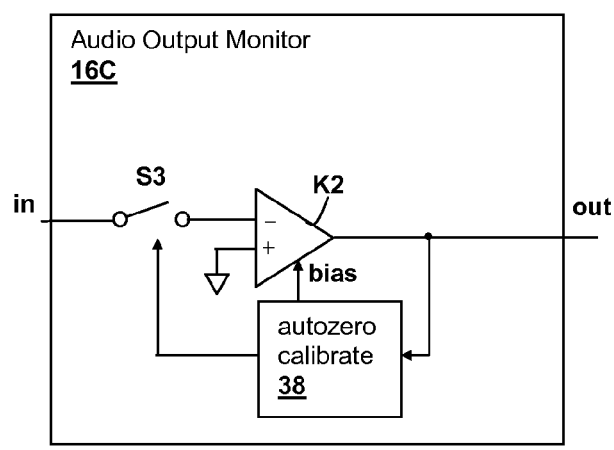
FIG. 3B is a schematic diagram depicting an audio output monitor circuit 16C that may be used to implement audio output monitor circuit 16 of FIG. 1, in accordance with another embodiment of the present invention.

Referring now to FIG. 3B, an audio output monitor circuit 16C that may alternatively be used to implement audio output monitor circuit 16 of FIG. 1. An autozero comparator K2 has a bias input bias adjusted by an autozero calibration circuit 38 that removes voltage offset from comparator K2 by measuring the offset value at output signal out while comparator K2 is occasionally taken off-line by opening switch S3.

Figure 5:
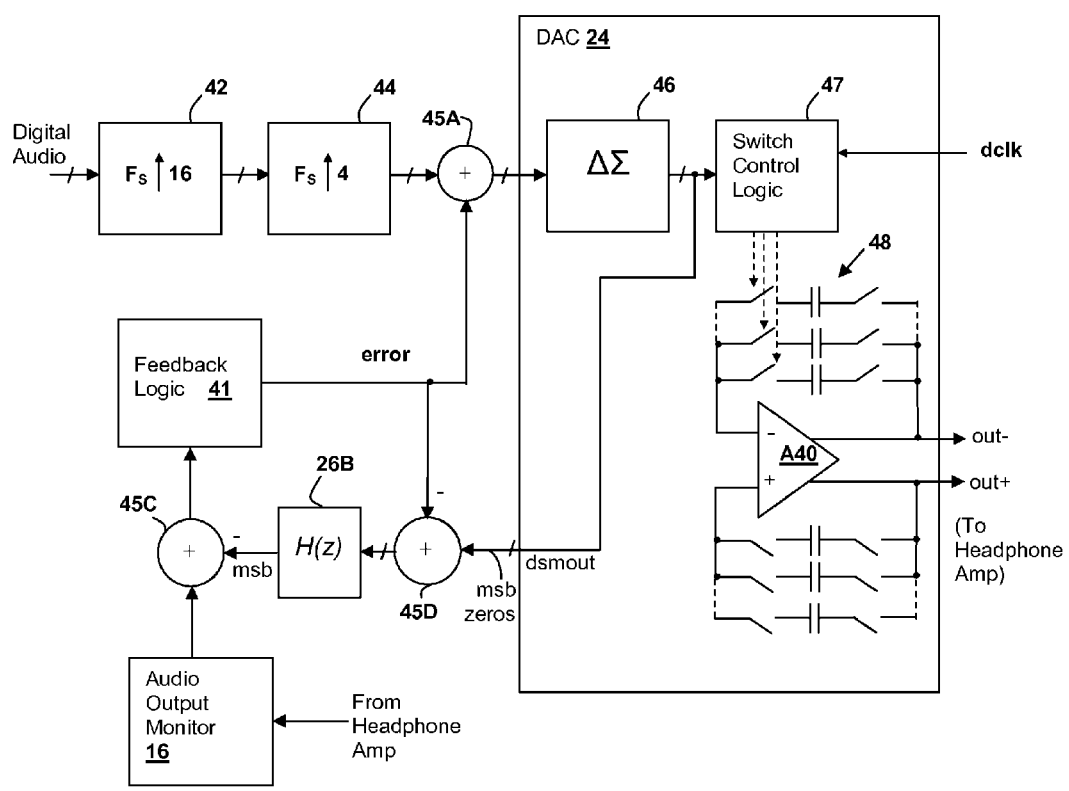
FIG. 5 is a simplified schematic diagram depicting portions of an audio output circuit in accordance with another embodiment of the present invention.
Figure 6:
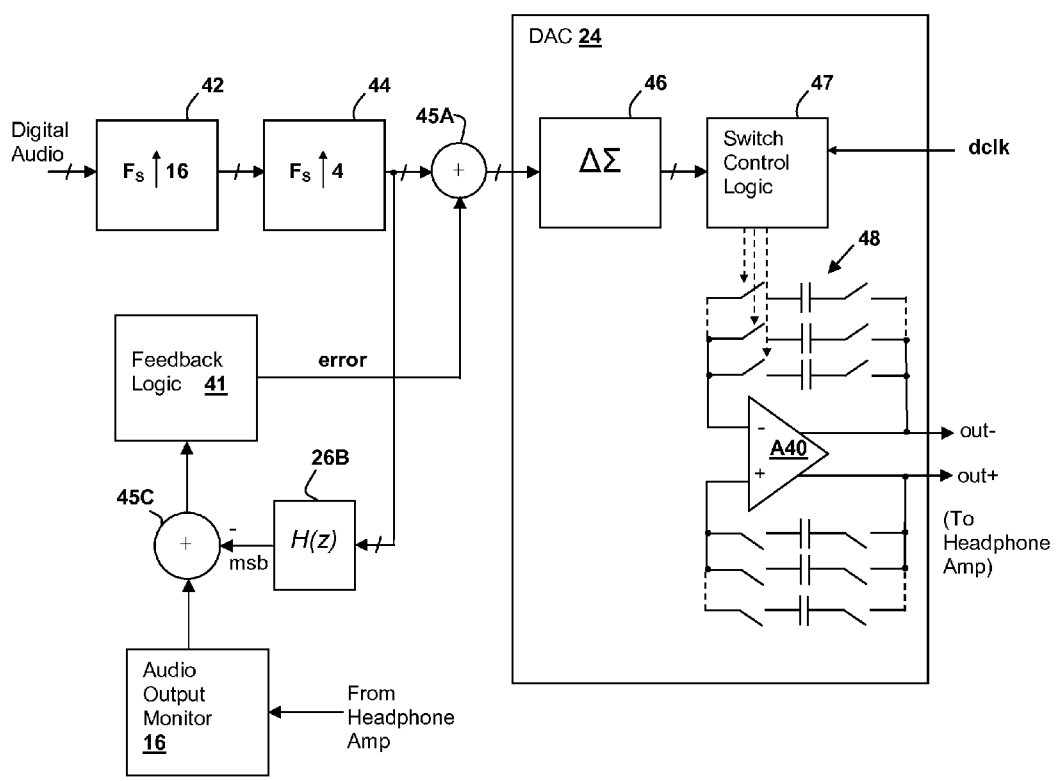
FIG. 6 is a simplified schematic diagram depicting portions of an audio output circuit in accordance with yet another embodiment of the present invention.

Referring again to FIG. 2, in order to properly alter the value of the digital audio input in practical circuit implementations, there are several alternatives as to the location where the digital values compared to the output of the audio output monitor are taken, and where the offset correction is applied. In general, as shown in FIG. 2, the offset must be applied at a point in the digital processing stages that follows the point where the offset comparison is made. Otherwise, the applied error signal will need to be removed somehow from the signal that is compared to the output of the audio output monitor. The following embodiments, described with reference to FIGS. 4-6, illustrate a variety of configurations for applying the offset correction and making the offset comparisons at different locations within the digital processing stages.

Figure 4:
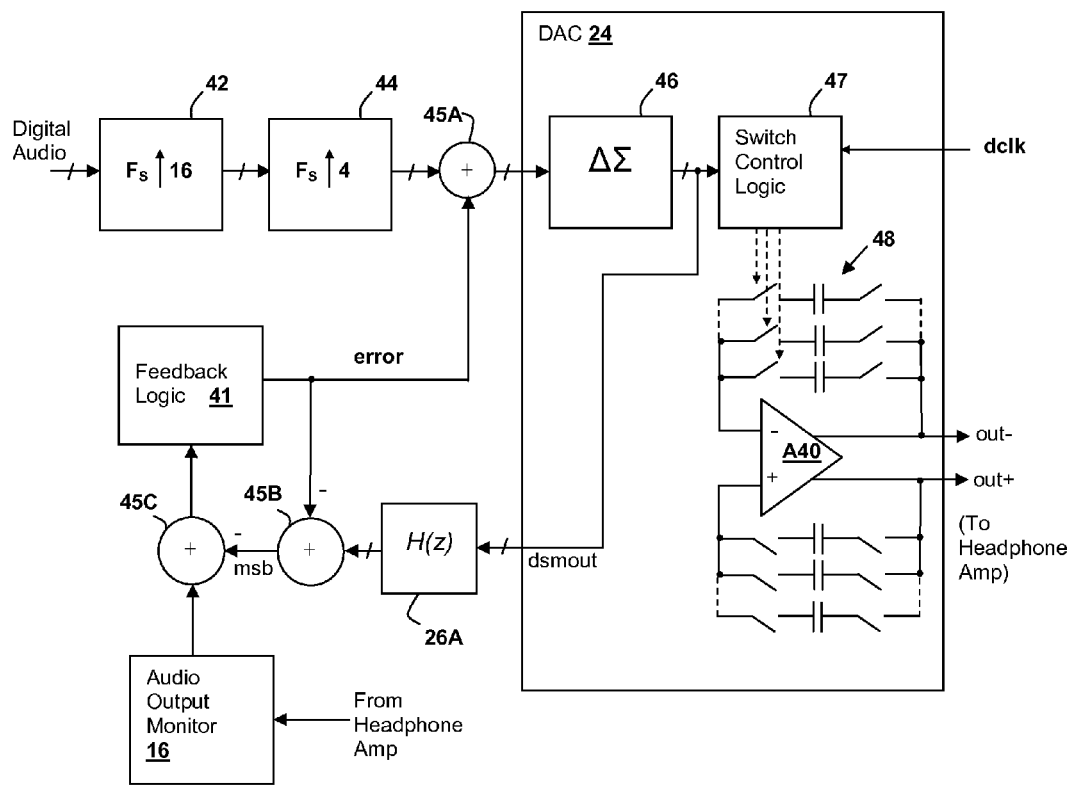
FIG. 4 is a simplified schematic diagram depicting portions of an audio output circuit in accordance with an embodiment of the present invention.

Referring now to FIG. 4, portions of an audio output circuit in accordance with an embodiment of the present invention are shown. Digital audio values are received at digital audio input Digital Audio and are interpolated to a rate 16 times greater than the input sample rate by interpolation block 42. The output of interpolation block 42 is interpolated to a rate 4 times greater than the output of interpolation block 42 by interpolation block 44, yielding an output at a rate 64 times greater than the input sample rate at digital audio input Digital Audio. Before the output of interpolation block 44 is provided to the input of DAC 24, a combiner 45A combines error values error with the output of interpolation block 44, which provides correction for offset that happens upstream of combiner 45A. DAC 24 includes a delta-sigma modulator (DSM) 46 that generates a noise-shaped digital output, generally at a much lower resolution than that of the input digital signal path through interpolation block 42 and 44. For example, the resolution of the digital audio stream from digital audio input Digital Audio up to the input of DSM 46 may be 16-bit, with the output of DSM 46 at 4-bit.

The output of DSM 46 is used to control switches in a switched-capacitor voltage source formed by amplifier A40 and a number of switched capacitor circuits 48. Switch control logic 47 generates the switch control signals from the output of DSM 46 and a clock signal. The result is that noise-shaped voltage outputs are generated at DAC outputs out− and out+, which represent a noise-shaped version of the digital audio values provided to digital audio input Digital Audio. In the audio output circuit depicted in FIG. 4, the digital value dsmout used for comparison with the output of audio output monitor 16 is taken from the output of DSM 46 and therefore is generally at a lower resolution than the resolution of the digital audio stream at combiner 45A. A transform block 26A is more easily constructed at the lower resolution of the output of DSM 46 and processes the digital value dsmout as described above to provide an output to a combiner 45B, which removes the correction value error from the output of transform block 26A. The removal of correction value error is necessary because the digital value being compared to the audio output monitor 16 is taken after the point at which the correction has been applied, i.e., after combiner 45A. For correct operation of the servo loop depicted in FIG. 4, digital value dsmout is either low-pass filtered by the limited bandwidth of DAC 24, amplifier A40, or both. Otherwise, offset in the audio output circuit may never be detected due to the large step sizes of DSM 46. In portable audio applications, it is generally the case that analog stages, such as amplifier A40 and DAC 24, will be bandwidth limited, since power consumption is tightly controlled and additional bandwidth generally requires additional power. Transformation block 26A, as mentioned above, will ideally match the low-pass response of the audio output circuits so that the servo loop will converge rapidly.

Correction value error is provided from feedback logic 41, which receives the output of a combiner 45C that compares the most significant bit msb of the output of combiner 45B with the output of audio output monitor 16, which operates as described above with reference to FIGS. 1-3. Feedback logic 41 may accumulate or otherwise filter correction signal error, or the output of combiner 45C may be passed directly to combiner 45A as correction signal error.

Referring now to FIG. 5, portions of an audio output circuit in accordance with another embodiment of the present invention are shown. The audio output circuit of FIG. 5 is similar to that of FIG. 4 described above, so only differences between them will be described in further detail below. In the circuit of FIG. 5, rather than process DSM 46 output dsmout with a transform block, correction signal error is first removed by a combiner 45D from a version of DSM 46 output dsmout that has been leading-zero-filled or otherwise padded to the full resolution of correction signal error. A transform block 26B then processes the output of combiner 45D and the most significant bit of the output of transform block 26B is compared to the output of audio output monitor 16 with combiner 45C. Feedback logic 41 operates as described above to apply correction signal error to combiner 45A.

Referring now to FIG. 6, portions of an audio output circuit in accordance with another embodiment of the present invention are shown. The audio output circuit of FIG. 6 is similar to that of FIGS. 4-5 described above, so only differences between them will be described in further detail below. In the circuit of FIG. 6, rather using DSM 46 output dsmout for the comparison input, the output of interpolator 44 is provided to transform block 26B, and the remainder of the servo loop is the same as that illustrated in FIG. 5. The circuit of FIG. 6 is consistent with the circuit depicted in FIG. 2, in that correction value error need not be removed from the values being compared to the output of audio output monitor 16, since the point at which the input to the comparison is obtained is upstream of the application of correction signal error.

Figure 7:
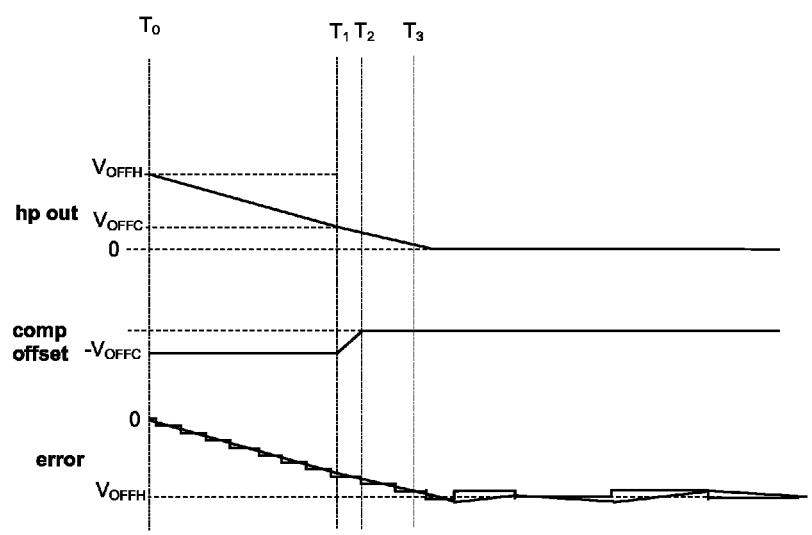
FIG. 7 is a waveform diagram depicting analog signals and representations of digital values in a circuit according to an embodiment of the present invention.

Referring now to FIG. 7, a waveform diagram depicting analog waveforms and representations of digital values in a headphone amplifier circuit according to an embodiment of the present invention is shown. The exemplary headphone output waveform hp out is representative, in general, of the behavior of each of the above-illustrated embodiments. However, signals particular to the embodiment of FIG. 2 and the like are illustrated, as well. Variations between the different embodiments will lead to different resulting waveforms in practice. The exemplary waveforms are shown with no audio signal present, for clarity, but as described above, operation of the offset correcting circuit will remove offset whether audio signal is present or not as long as the output of the circuit is not in a comparator dead-band. At time $T_0$, the headphone amplifier circuit starts operating and headphone output hp out has an offset voltage of $V_{OFFH}$. Digital error value error starts at zero and begins to fall toward a value representing offset voltage $V_{OFFH}$. At time $T_1$, the voltage of headphone output hp out reaches a value of $V_{OFFC}$, which is equal in magnitude of the initial output of the comparator in the audio output monitor. At this point, the comparator begins to calibrate to remove its own internal offset, which is removed at time $T_2$. At time $T_3$, error value error has substantially reached a value corresponding to the negative of offset voltage $V_{OFFH}$ and after time $T_3$, will alternate between two or more digital values to maintain removal of an average that is equal to the negative of offset voltage $V_{OFFH}$.

While the invention has been particularly shown and described with reference to the preferred embodiments thereof, it will be understood by those skilled in the art that the foregoing and other changes in form and details may be made therein without departing from the spirit and scope of the invention.

What is claimed is:

1. An electronic audio device, comprising:
  an audio output for providing an audio output signal to an external device, wherein the audio output signal has a DC offset;
  a digital-to-analog converter for converting digital input values to an analog signal at an output of the digital-to-analog converter, wherein the audio output is generated from the output of the digital-to-analog converter;
  an audio output monitor having an input coupled to the audio output signal;
  a comparison circuit for comparing an output of the audio output monitor with the digital input values to generate error values indicative of a DC offset of the audio output signal from a comparison of first transitions in the output of the audio output monitor with second transitions in the digital input values, wherein the comparison circuit includes a hold function, and wherein the comparison circuit determines the value of the DC offset during a measurement interval and holds the output of the comparison circuit after the measurement interval, whereby continuous changes in the DC offset caused by changes in the output of the comparison circuit are avoided, and wherein the comparison circuit further comprises a timer that triggers the measurement interval at periods of greater than 50 milliseconds; and
  a combining circuit for adjusting the digital input values in conformity with the error values to reduce the DC offset of the audio output signal.

2. The electronic audio device of claim 1, wherein the audio output is an output for providing a headphone signal to an external headphone.

3. The electronic audio device of claim 1, wherein the comparison circuit comprises a low-pass filter for filtering a difference between the first transitions and the second transitions to generate the output of the comparison circuit, whereby the combining circuit combines an average deviation between the first transitions and the second transitions with the audio output signal.

4. The electronic audio device of claim 1, further comprising a transform block coupled between the digital-to-analog-converter and the comparison circuit, whereby a response of the comparison circuit to the digital input value is matched to the response of the audio output signal to the digital input value.

5. The electronic audio device of claim 4, wherein the transform block is a delay block for compensating for a delay between the digital input value and the audio output signal.

6. The electronic audio device of claim 1, wherein the audio output monitor is a zero-crossing detector.

7. The electronic audio device of claim 6, wherein the zero-crossing detector is an autozero comparator.

8. The electronic audio device of claim 6, wherein the zero-crossing detector is a chopped comparator.

9. The electronic audio device of claim 8, further comprising a pseudo-random sequence generator for generating a chopping control signal, and wherein a control input of the chopped comparator is coupled to an output of the pseudo-random sequence generator.

10. The electronic audio device of claim 8, wherein the chopped comparator comprises an offset removal circuit comprising:
  an integrator for integrating an unrestored output of the chopped comparator; and
  an input offset adjusting circuit responsive to an output of the integrator.

11. A method of reducing DC offset in an analog output of an electronic audio device that receives digital input values from which an output signal provided by the analog output is generated, the method comprising:
  monitoring the output signal for events having a time related to the DC offset;
  comparing first transitions resulting from the monitoring to second transitions in the digital input values, wherein the comparing determines the value of the DC offset during a measurement intervals;
  generating, from a result of the comparing, a correction value for the output signal that removes the DC offset;
  triggering the measurement intervals at periods of greater than 50 milliseconds;
  correcting the output signal according to the correction value; and
  holding the correction value between the measurement intervals, whereby continuous changes in the DC offset caused by the correcting are avoided.

12. The method of claim 11, wherein the monitoring comprises detecting zero-crossings in the output signal, and wherein the comparing comprises comparing a sign of the values of the digital input values to a result of the detecting.

13. The method of claim 11, wherein the comparing comprises:
  determining differences between the first transitions and the second transitions; and
  filtering a result of the determining, and wherein the generating generates the correction value from a result of the filtering.

14. The method of claim 11, further comprising processing the digital input values to match the response of the analog output to the digital input signal to generate an input to the comparing, whereby a response of the comparison circuit to the digital input values is matched to the response of the audio output signal to the digital input value.

15. The method of claim 14, wherein the processing comprises delaying the digital input values.

16. An electronic audio device, comprising:
  an audio output for providing an audio output signal to an external device, wherein the audio output signal has a DC offset;
  a digital-to-analog converter for converting digital input values to an analog signal at an output of the digital-to-analog converter, wherein the audio output is generated from the output of the digital-to-analog converter;
  an audio output monitor having an input coupled to the audio output signal, wherein the audio output monitor is a zero-crossing detector implemented by a chopped comparator;
  a pseudo-random sequence generator for generating a chopping control signal, wherein a control input of the chopped comparator is coupled to an output of the pseudo-random sequence generator;
  a comparison circuit for comparing an output of the audio output monitor with the digital input values to generate error values indicative of a DC offset of the audio output signal from a comparison of first transitions in the output of the audio output monitor with second transitions in the digital input values;

a combining circuit for adjusting the digital input values in conformity with the error values to reduce the DC offset of the audio output signal.

17. An electronic audio device, comprising:

an audio output for providing an audio output signal to an external device, wherein the audio output signal has a DC offset;

a digital-to-analog converter for converting digital input values to an analog signal at an output of the digital-to-analog converter, wherein the audio output is generated from the output of the digital-to-analog converter;

an audio output monitor having an input coupled to the audio output signal, wherein the audio output monitor is a zero-crossing detector implemented by a chopped comparator, wherein the chopped comparator comprises an offset removal circuit including an integrator for integrating an unrestored output of the chopped comparator and an input offset adjusting circuit responsive to an output of the integrator;

a comparison circuit for comparing an output of the audio output monitor with the digital input values to generate error values indicative of a DC offset of the audio output signal from a comparison of first transitions in the output of the audio output monitor with second transitions in the digital input values; and a combining circuit for adjusting the digital input values in conformity with the error values to reduce the DC offset of the audio output signal.

18. An electronic audio device, comprising:

an audio output for providing an audio output signal to an external device, wherein the audio output signal has a DC offset;

a digital-to-analog converter for converting digital input values to an analog signal at an output of the digital-to-analog converter, wherein the audio output is generated from the output of the digital-to-analog converter;

an audio output monitor having an input coupled to the audio output signal;

a comparison circuit for comparing an output of the audio output monitor with the digital input values to generate error values indicative of a DC offset of the audio output signal from a comparison of first transitions in the output of the audio output monitor with second transitions in the digital input values, wherein the comparison circuit includes a hold function, wherein the comparison circuit determines the value of the DC offset during a measurement interval and holds the output of the comparison circuit after the measurement interval, whereby continuous changes in the DC offset caused by changes in the output of the comparison circuit are avoided, wherein the measurement interval is triggered by changes in a control value of a volume control coupled between the output of the digital-to-analog converter and the audio output; and a combining circuit for adjusting the digital input values in conformity with the error values to reduce the DC offset of the audio output signal.

19. The electronic audio device of claim 18, wherein the comparison circuit further comprises a timer that triggers the measurement interval at periods of greater than 50 milliseconds when changes in the control value of the volume control are not occurring and triggers the measurement interval continuously when the changes in the control value of the volume control are occurring.

20. A method of reducing DC offset in an analog output of an electronic audio device that receives digital input values from which an output signal provided by the analog output is generated, the method comprising:

monitoring the output signal for events having a time related to the DC offset;

comparing first transitions resulting from the monitoring to second transitions in the digital input values, wherein the comparing determines the value of the DC offset during a measurement intervals;

generating, from a result of the comparing, a correction value for the output signal that removes the DC offset;

triggering the measurement intervals in response to changes in a control value of a volume control coupled to the digital input values and the analog output;

correcting the output signal according to the correction value; and holding the correction value between the measurement intervals, whereby continuous changes in the DC offset caused by the correcting are avoided.

21. The method of claim 20, further comprising:

triggering the measurement intervals at periods of greater than 50 milliseconds when changes in the control value of the volume control are not occurring; and triggering the measurement intervals continuously when the changes in the control value of the volume control are occurring.

* * * * *